(12) United States Patent
Li et al.

(10) Patent No.: US 10,412,855 B2
(45) Date of Patent: Sep. 10, 2019

(54) AIR DEFLECTION SYSTEM

(71) Applicant: Huawei Technologies Co., Ltd., Shenzhen (CN)

(72) Inventors: Wei Li, Shenzhen (CN); Zhao Zhang, Shenzhen (CN); Jie Chen, Shenzhen (CN); Nan Wang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 502 days.

(21) Appl. No.: 14/974,549

(22) Filed: Dec. 18, 2015

(65) Prior Publication Data

US 2016/0105993 A1 Apr. 14, 2016

Related U.S. Application Data

(63) Continuation of application No. PCT/CN2014/080563, filed on Jun. 24, 2014.

(30) Foreign Application Priority Data

Jan. 23, 2014 (CN) .......................... 2014 1 0033727

(51) Int. Cl.
*H05K 7/20* (2006.01)

(52) U.S. Cl.
CPC ..... *H05K 7/20127* (2013.01); *H05K 7/20572* (2013.01)

(58) Field of Classification Search
USPC ...................................................... 454/184
See application file for complete search history.

(56) References Cited

U.S. PATENT DOCUMENTS 3,192,306 A * 6/1965 Skonnord .......... H05K 7/20572
165/80.3
3,396,780 A 8/1968 Koltuniak
(Continued)

FOREIGN PATENT DOCUMENTS

CN 201008247 Y 1/2008
CN 102238854 A 11/2011
(Continued)

OTHER PUBLICATIONS

Partial English Translation and Abstract of Chinese Patent Application No. CN102238854, dated Apr. 19, 2016, 3 pages.
(Continued)

*Primary Examiner* — Gregory L Huson
*Assistant Examiner* — Frances F. Hamilton
(74) *Attorney, Agent, or Firm* — Conley Rose, P.C.

(57) ABSTRACT

An air deflection system includes a cabinet and an air deflection cabinet. The cabinet includes a cabinet first air vent on a lower part of a cabinet first side, a cabinet second air vent at a top of the cabinet, and a cabinet third air vent on a cabinet second side for cool air to enter. The air deflection cabinet includes an air deflection cabinet first air vent at a top of the air deflection cabinet and an air deflection cabinet second air vent on an air deflection cabinet first side that is proximate to the cabinet first side. The air deflection cabinet second air vent is in communication with the cabinet first air vent such that warm air exhausted through the cabinet first air vent enters the air deflection cabinet through the air deflection cabinet second air vent and is exhausted through the air deflection cabinet first air vent.

17 Claims, 6 Drawing Sheets

(56) References Cited

U.S. PATENT DOCUMENTS

| | | | | |
|---|---|---|---|---|
| 4,535,386 A * | 8/1985 | Frey, Jr. | H05K 7/206 | 165/104.33 |
| 4,683,424 A * | 7/1987 | Cutright | G01R 1/04 | 324/537 |
| 5,216,579 A * | 6/1993 | Basara | G06F 1/184 | 174/481 |
| 5,398,159 A * | 3/1995 | Andersson | H05K 7/20572 | 361/695 |
| 5,646,825 A * | 7/1997 | Huttenlocher | H02B 1/565 | 165/104.33 |
| 5,655,381 A * | 8/1997 | Huttenlocher | H02B 1/565 | 361/696 |
| 5,782,546 A * | 7/1998 | Iwatare | H05K 9/0041 | 312/236 |
| 6,151,210 A * | 11/2000 | Cercioglu | H05K 7/20572 | 165/104.33 |
| 6,185,098 B1 * | 2/2001 | Benavides | H05K 7/1488 | 174/387 |
| 6,186,890 B1 * | 2/2001 | French | H05K 7/20572 | 361/695 |
| 6,341,064 B1 * | 1/2002 | Bradley | H02B 1/565 | 361/695 |
| 6,410,850 B1 * | 6/2002 | Abel | G02B 6/3897 | 174/60 |
| 6,516,954 B2 * | 2/2003 | Broome | H05K 7/186 | 211/26 |
| 6,611,428 B1 | 8/2003 | Wong | | |
| 6,819,563 B1 * | 11/2004 | Chu | G11B 33/1406 | 165/104.33 |
| 6,987,673 B1 | 1/2006 | French et al. | | |
| 7,182,208 B2 * | 2/2007 | Tachibana | H05K 7/20572 | 211/26 |
| 7,486,511 B1 * | 2/2009 | Griffel | H05K 7/20745 | 361/679.46 |
| 7,688,578 B2 * | 3/2010 | Mann | H05K 7/20745 | 361/679.46 |
| 7,735,326 B2 * | 6/2010 | Crippen | F25B 21/02 | 62/259.2 |
| 7,854,652 B2 * | 12/2010 | Yates | E04H 5/02 | 361/690 |
| 7,907,402 B2 * | 3/2011 | Caveney | H05K 7/20736 | 312/223.2 |
| 7,911,789 B2 * | 3/2011 | Sasagawa | G06F 1/187 | 165/104.33 |
| 7,916,470 B2 * | 3/2011 | Mills | H05K 7/20736 | 312/236 |
| 7,974,105 B2 * | 7/2011 | Dean, Jr. | H04Q 1/062 | 361/826 |
| 8,144,464 B2 * | 3/2012 | VanDerVeen | H05K 7/20736 | 165/104.34 |
| 8,215,498 B2 * | 7/2012 | Rathbone | H05K 7/1497 | 211/26.2 |
| 8,254,122 B2 * | 8/2012 | Chang | H05K 7/20736 | 361/690 |
| 8,331,086 B1 * | 12/2012 | Meissner | H05K 7/20127 | 312/223.2 |
| 8,405,984 B2 * | 3/2013 | Donowho | H05K 7/20572 | 312/236 |
| 8,582,292 B1 * | 11/2013 | Eichelberg | H05K 7/20736 | 361/679.49 |
| 8,593,815 B2 * | 11/2013 | Claassen | H05K 7/20736 | 312/223.2 |
| 8,743,540 B1 * | 6/2014 | Nishihara | H05K 7/20572 | 165/104.33 |
| 9,007,746 B2 * | 4/2015 | Rajvanshi | H02B 1/565 | 165/104.33 |
| 9,022,233 B2 * | 5/2015 | Williams | A47B 88/00 | 211/26 |
| 9,198,310 B2 * | 11/2015 | Eichelberg | H05K 7/20745 | |
| 9,321,136 B2 * | 4/2016 | Eckberg | H05K 7/2079 | |
| 9,392,733 B2 * | 7/2016 | Day | H05K 7/20745 | |
| 2006/0056151 A1 * | 3/2006 | Hara | H05K 7/20145 | 361/696 |
| 2007/0165377 A1 * | 7/2007 | Rasmussen | H05K 7/2079 | 361/695 |
| 2007/0171613 A1 * | 7/2007 | McMahan | H05K 7/20736 | 361/695 |
| 2007/0173189 A1 * | 7/2007 | Lewis | H05K 7/20009 | 454/184 |
| 2008/0266789 A1 * | 10/2008 | Hruby | H05K 7/20572 | 361/692 |
| 2013/0308265 A1 * | 11/2013 | Arnouse | H05K 7/1488 | 361/679.41 |
| 2013/0309957 A1 | 11/2013 | Fleming et al. | | |
| 2014/0024465 A1 * | 1/2014 | Bodenweber | H05K 7/20127 | 463/46 |
| 2014/0079365 A1 * | 3/2014 | Hill | G02B 6/4455 | 385/135 |
| 2015/0208554 A1 * | 7/2015 | Leigh | G06F 1/20 | 165/80.3 |

FOREIGN PATENT DOCUMENTS

| | | | | |
|---|---|---|---|---|
| CN | 102724848 A | * | 10/2012 | H05K 7/20572 |
| CN | 202475962 U | | 10/2012 | |
| CN | 202535670 U | | 11/2012 | |
| CN | 202788073 U | | 3/2013 | |
| CN | 103220894 A | | 7/2013 | |
| DE | 202005002849 U1 | | 5/2005 | |
| DE | 202005002849 U1 | * | 6/2005 | |
| EP | 1307082 A2 | | 5/2003 | |
| EP | 2071910 A1 | | 6/2009 | |
| GB | 2520256 A | * | 5/2015 | |
| JP | H04332196 A | | 11/1992 | |
| JP | 3058713 B2 | | 7/2000 | |
| JP | 2005348534 A | | 12/2005 | |

OTHER PUBLICATIONS

Partial English Translation and Abstract of Chinese Patent Application No. CN202475962, dated Dec. 18, 2015, 3 pages.
Partial English Translation and Abstract of Chinese Patent Application No. CN202535670, dated Dec. 18, 2015, 3 pages.
Partial English Translation and Abstract of Dutch Patent Application No. DE202005002849, dated Dec. 18, 2015, 8 pages.
Foreign Communication From A Counterpart Application, PCT Application No. PCT/CN2014/080563, English Translation of International Search Report dated Oct. 27, 2014, 3 pages.
Foreign Communication From A Counterpart Application, PCT Application No. PCT/CN2014/080563, Written Opinion dated Oct. 27, 2014, 6 pages.
Foreign Communication From A Counterpart Application, European Application No. 14879676.6, Extended European Search Report dated May 30, 2016, 9 pages.
Machine Translation and Abstract of Chinese Publication No. CN202788073, Mar. 13, 2013, 6 pages.
Foreign Communication From A Counterpart Application, Chinese Application No. 201410033727.X, Chinese Search Report dated Feb. 28, 2017, 2 pages.
Foreign Communication From A Counterpart Application, Chinese Application No. 201410033727.X, Chinese Office Action dated Mar. 9, 2017, 6 pages.

* cited by examiner

Front

AIR DEFLECTION SYSTEM

CROSS-REFERENCE TO RELATED APPLICATIONS

This application is a continuation of International Application No. PCT/CN2014/080563, filed on Jun. 24, 2014, which claims priority to Chinese Patent Application No. 201410033727.X filed on Jan. 23, 2014, both of which are hereby incorporated by reference in their entireties.

TECHNICAL FIELD

The present disclosure relates to communications technologies, and in particular, to an air deflection system for a communications device.

BACKGROUND

With the rapid development of the communications industry, needs for information services constantly increase. To meet the growing user needs, network operators need to add more devices. However, due to limited installation space in an equipment room, density of communications devices is becoming higher, the size of the devices is becoming smaller, but power of the devices is becoming higher. Therefore, how to resolve a problem of ventilation and heat dissipation for a compact device of high power consumption becomes an urgent problem to be resolved in design of a communications device.

At present, a communications device generally includes multiple communications boards, and the communications boards are inserted into slots disposed on a backplane in a cabinet. Because the size of the cabinet is becoming smaller, and an integration level of the communications device is becoming higher, the problem of ventilation and heat dissipation for the communications device becomes one of bottlenecks in board subrack design. In the prior art, conventional air cooling is adopted for a communications device. That is, a running communications device is cooled by using a fan. For air-cooled heat dissipation, an air exhaust problem is involved, and heat is dissipated for the communications device often in a manner in which air flows in from the front and flows out from the rear or air flows in from the front and flows out from the bottom. However, neither air flowing out from the rear nor air flowing out from the bottom helps heat dissipation of an entire equipment room. Consequently, the heat dissipation efficiency of the entire equipment room is relatively low.

SUMMARY

Embodiments of the present disclosure provide an air deflection system, which resolves a problem of relatively low heat dissipation efficiency of an equipment room without changing a device layout in the equipment room. The embodiments of the present disclosure provide another air deflection system, to resolve a problem of precise air supply. The embodiments of the present disclosure provide another air deflection system, to resolve a problem of heat dissipation of a double-faced cabinet located in an equipment room with cool and hot aisles.

A first aspect of the embodiments of the present disclosure discloses an air deflection system, including a cabinet, where an air vent is disposed on a side of the cabinet, the air vent is located in a lower part of the side, an air vent is disposed at the top of the cabinet, and the cabinet is provided with a side for cool air to enter; and further including at least one air deflection cabinet, where an air vent is disposed at the top of the air deflection cabinet, an air vent is disposed on a side of the air deflection cabinet, the air-vent-disposed side of the air deflection cabinet clings to the air-vent-disposed side of the cabinet, and the side air vent of the air deflection cabinet is in communication with the side air vent of the cabinet, so that warm air exhausted through the side air vent of the cabinet enters the air deflection cabinet through the side air vent of the air deflection cabinet, and is exhausted through the top air vent of the air deflection cabinet.

With reference to the first aspect, in a first implementation manner of the first aspect, a specification of the side air vent of the air deflection cabinet is the same as a specification of the side air vent of the cabinet, and a location of the side air vent of the air deflection cabinet is corresponding to a location of the side air vent of the cabinet.

With reference to the first aspect or the first implementation manner of the first aspect, in a second implementation manner of the first aspect, the air deflection cabinet further includes a fiber management unit configured to coil up an optical fiber.

With reference to the first aspect or the first implementation manner of the first aspect or the second implementation manner of the first aspect, in a third implementation manner of the first aspect, the air deflection system further includes a connecting plate, where the air deflection cabinet and the cabinet are fastened together by using the connecting plate.

A second aspect of the embodiments of the present disclosure discloses another air deflection system, including a cabinet, where an air vent is disposed on a side of the cabinet, the air vent is located in a lower part of the side, an air vent is disposed at the top of the cabinet, and the cabinet is provided with a side for cool air to enter; and further including at least one air deflection cabinet, where an air vent is disposed at the top of the air deflection cabinet, a side of the air deflection cabinet is provided with an opening, the opening-disposed side of the air deflection cabinet clings to the air-vent-disposed side of the cabinet, and a projection of the opening of the air deflection cabinet on the side of the cabinet overlaps the side air vent of the cabinet, so that warm air exhausted through the side air vent of the cabinet enters the air deflection cabinet through the opening of the air deflection cabinet, and is exhausted through the top air vent of the air deflection cabinet.

With reference to the second aspect, in a first implementation manner of the second aspect, the air deflection cabinet further includes a fiber management unit configured to coil up an optical fiber.

With reference to the second aspect or the first implementation manner of the second aspect, in a second implementation manner of the second aspect, the air deflection system further includes a connecting plate, where the air deflection cabinet and the cabinet are fastened together by using the connecting plate.

A third aspect of the embodiments of the present disclosure discloses another air deflection system. The air deflection system includes a cabinet, where an air vent is disposed on a side of the cabinet, the air vent is located in a lower part of the side, an air vent is disposed at the top of the cabinet, and the cabinet is provided with a side for cool air to enter; and further includes at least one air deflection cabinet, where an air vent is disposed at the top of the air deflection cabinet, an air vent is disposed on a side of the air deflection cabinet, the air-vent-disposed side of the air deflection cabinet is adjacent to the air-vent-disposed side of the cabinet, and the side air vent of the air deflection cabinet is connected to the side air vent of the cabinet by a duct, so that warm air exhausted through the side air vent of the cabinet enters the air deflection cabinet through the side air vent of the air deflection cabinet, and is exhausted through the top air vent of the air deflection cabinet.

With reference to the third aspect, in a first implementation manner of the third aspect, the air deflection cabinet further includes a fiber management unit configured to coil up an optical fiber.

With reference to the third aspect or the first implementation manner of the third aspect, in a second implementation manner of the third aspect, the air deflection system further includes a connecting plate, where the air deflection cabinet and the cabinet are fastened together by using the connecting plate.

A fourth aspect of the embodiments of the present disclosure discloses another air deflection system. The air deflection system includes a cabinet, where an air vent is disposed on a side of the cabinet, and an air vent is disposed at the top of the cabinet, an air vent is disposed in a lower part of the cabinet, where the lower air vent includes at least one of a lower air vent on the front of the cabinet and a lower air vent on the back of the cabinet; and further includes at least one air deflection cabinet, where an air vent is disposed at the bottom of the air deflection cabinet, an air vent is disposed on a side of the air deflection cabinet, and the side air vent of the air deflection cabinet is connected to the side air vent of the cabinet, so that cool air enters through the bottom air vent of the air deflection cabinet, and then enters the cabinet through the side air vent of the air deflection cabinet.

With reference to the fourth aspect, in a first implementation manner of the fourth aspect, the air deflection cabinet further includes a fiber management unit configured to coil up an optical fiber.

With reference to the fourth aspect or the first implementation manner of the fourth aspect, in a second implementation manner of the fourth aspect, a specification of the side air vent of the air deflection cabinet is the same as a specification of the side air vent of the cabinet, and the air-vent-disposed side of the air deflection cabinet clings to the air-vent-disposed side of the cabinet, so that the side air vent of the air deflection cabinet correspondingly is in communication with the side air vent of the cabinet.

With reference to the fourth aspect or the first implementation manner of the fourth aspect, in a third implementation manner of the fourth aspect, the side air vent of the air deflection cabinet is in communication with the side air vent of the cabinet by a duct.

A fifth aspect of the embodiments of the present disclosure discloses another air deflection system. The air deflection system includes a double-faced cabinet, where the double-faced cabinet is located in an equipment room with separated cold and hot aisles, an air vent is disposed at both the top and the bottom of the double-faced cabinet, an air vent is disposed on the front of the double-faced cabinet, and the front of the cabinet is located in the cold aisle, so that cool air can enter though the front air vent; and an air vent is disposed in both an upper part of the back and a lower part of the back of the double-faced cabinet, the back of the double-faced cabinet is located in the hot aisle, an air vent is disposed on a side of the double-faced cabinet, and the air vent is close to the back of the double-faced cabinet; and further includes at least one air deflection cabinet, where an air vent is disposed on the front of the air deflection cabinet, the front of the air deflection cabinet is located in the cold aisle, an air vent is disposed on a side of the air deflection cabinet, the air-vent-disposed side of the air deflection cabinet clings to the air-vent-disposed side of the cabinet, and the side air vent of the air deflection cabinet is in communication with the side air vent of the cabinet, so that cool air can enter the air deflection cabinet through the front air vent of the air deflection cabinet, and enter the double-faced cabinet through the side air vent of the air deflection cabinet.

With reference to the fifth aspect, in a first implementation manner of the fifth aspect, the air deflection system further includes at least two air deflectors, where at least one air deflector of the air deflectors is connected to the top air vent of the double-faced cabinet, and at least one air deflector of the air deflectors is connected to the bottom air vent of the double-faced cabinet, so that the double-faced cabinet implements exhausts warm air towards the hot aisle.

With reference to the fifth aspect or the first implementation manner of the fifth aspect, in a second implementation manner of the fifth aspect, a specification of the side air vent of the air deflection cabinet is the same as a specification of the side air vent of the cabinet, and a location of the side air vent of the air deflection cabinet is corresponding to a location of the side air vent of the cabinet.

With reference to the fifth aspect or the first implementation manner of the fifth aspect or the second implementation manner of the fifth aspect, in a third implementation manner of the fifth aspect, the air deflection cabinet further includes a fiber management unit configured to coil up an optical fiber.

With reference to the fifth aspect or the first implementation manner of the fifth aspect or the second implementation manner of the fifth aspect or the third implementation manner of the fifth aspect, in a fourth implementation manner of the fifth aspect, the air deflection system further includes a connecting plate, where the air deflection cabinet and the cabinet are fastened together by using the connecting plate.

It can be known from the foregoing that, by means of an air deflection system provided by the embodiments of the present disclosure, it can be implemented that air flows in from the front and flows out from the bottom for a cabinet, which changes a path of warm air, facilitates top exhaust or recycling of warm air in an equipment room, and improves efficiency of warm air processing of the equipment room; by means of another air deflection system provided by the embodiments of the present disclosure, precise air supply can be implemented for a cabinet, and improves heat dissipation efficiency of a high-power device inside the cabinet; and by means of another air deflection system provided by the embodiments of the present disclosure, intake of cool air from the back of a double-faced cabinet can be implemented, which improves heat dissipation efficiency on the back of the double-faced cabinet.

BRIEF DESCRIPTION OF THE DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DETAILED DESCRIPTION

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
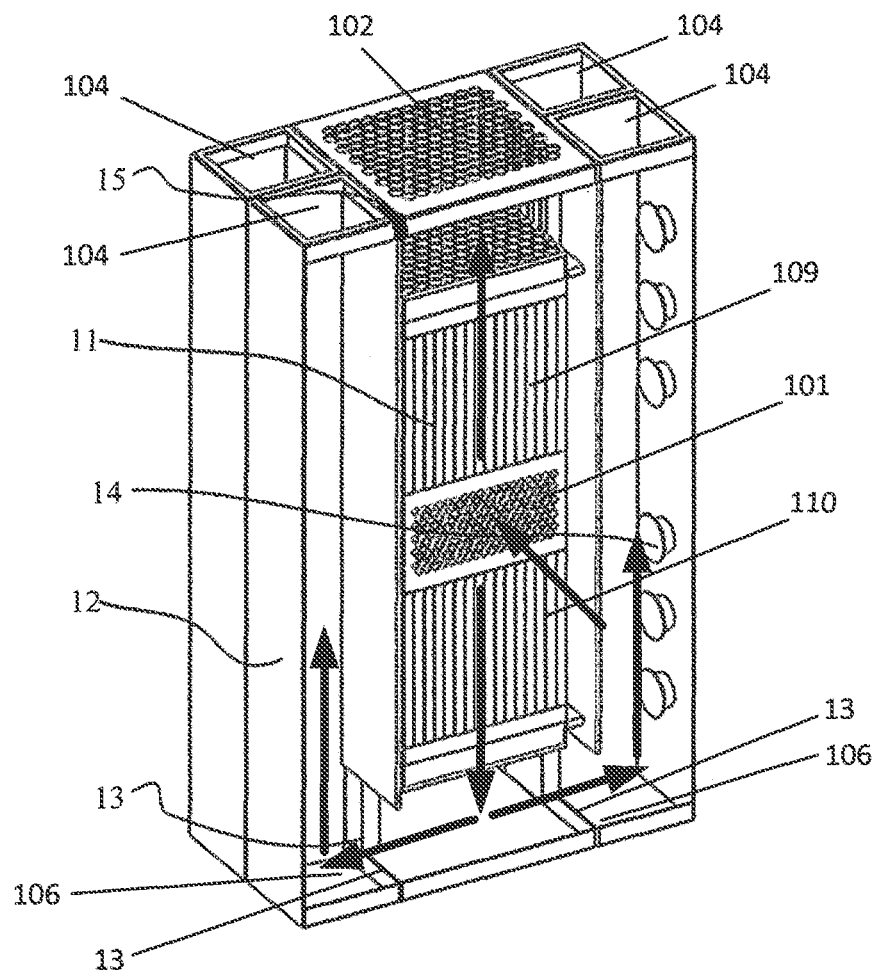
FIG. 1 is a schematic structural diagram of an air deflection system according to an embodiment of the present disclosure.

As shown in FIG. 1, an embodiment of the present disclosure provides an air deflection system, where the air deflection system includes a cabinet 11 and an air deflection cabinet 12. An air vent 101 is disposed on a side of the cabinet 11, where the air vent 101 is located in a middle of the cabinet. An air vent 102 is disposed at the top of the cabinet 11, and the cabinet 11 is provided with a side for cool air to enter. The air deflection system includes at least one air deflection cabinet 12. An air vent 104 is disposed at the top of the air deflection cabinet 12, and an air vent 106 is disposed on a side of the air deflection cabinet 12. The air-vent-disposed side of the air deflection cabinet 12 clings to the air-vent-disposed side of the cabinet 11, and the side The air-vent-disposed side of the air deflection cabinet 12 clings to the air-vent-disposed side of the cabinet 11, and the side air vent 106 of the air deflection cabinet 12 is in communication with a side air vent 13 of the cabinet 11, so that warm air exhausted through the side air vent 13 of the cabinet 11 enters the air deflection cabinet 12 through the side air vent 106 of the air deflection cabinet 12, and is exhausted through the top air vent 104 of the air deflection cabinet 12.

By means of the air deflection system provided in this embodiment of the present disclosure, cool air can enter through an air vent 101 in the middle of the cabinet 11. Some cool air flows towards the upper part of the cabinet 11 after entering the cabinet 11, takes away heat generated by a communications device 109 when going through the communications device inside the cabinet 11, and then is exhausted through the top air vent 102 of the cabinet 11. Some other cool air flows towards the lower part of the cabinet 11 after entering the cabinet 11, and takes away heat generated by the communications device 110 when going through the communications device inside the cabinet 11, then is deflected into the air deflection cabinet 12 through the side air vent 13 of the cabinet 11, and is exhausted through the top air vent 104 of the air deflection cabinet 12. A specification of the side air vent 106 of the air deflection cabinet 12 may be the same as or may be different from a specification of the side air vent 13 of the cabinet 11. However, a location of the side air vent 106 of the air deflection cabinet 12 is corresponding to a location of the side air vent 13 of the cabinet 11, so that warm air in the cabinet 11 can enter the air deflection cabinet 12 though the side air vent 106 of the air deflection cabinet 12.

As shown in FIG. 1, the air deflection cabinet 12 further includes a fiber management unit 14 configured to coil up an optical fiber, for example, coiling up an overlong optical fiber or an extra optical fiber. The cabinet 11 and the air deflection cabinet 12 are fastened together by using a connecting plate 15, or may be fastened together by using an adhesive tape or a rope. The air defection system in the present disclosure can exhaust warm air that is exhausted from the lower part of the side of the cabinet 11 from the top of the air deflection cabinet 12, which implements that air flows in from the front and flows out from the bottom for the cabinet, changes a path of warm air, facilitates top exhaust or recycling of warm air in an equipment room, and improves efficiency of warm air processing of the equipment room.

Figure 2:
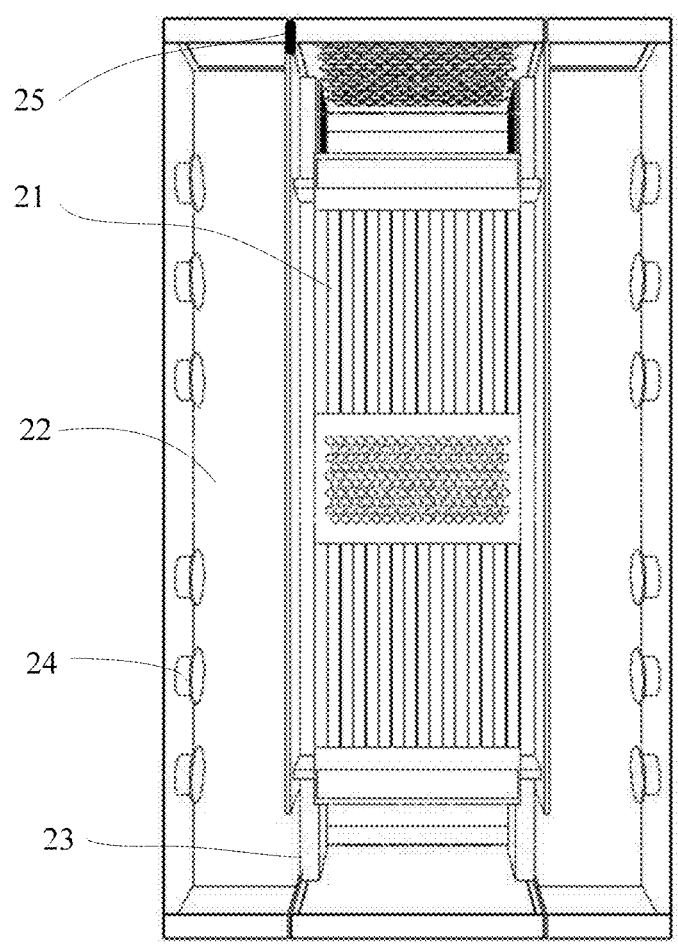
FIG. 2 is a schematic structural diagram of an air deflection system according to another embodiment of the present disclosure.

As shown in FIG. 2, an embodiment of the present disclosure provides another air deflection system, where the air deflection system includes a cabinet 21 and an air deflection cabinet 22. An air vent 23 is disposed on a side of the cabinet 21, where the air vent 23 is located in a lower part of the side of the cabinet 21. An air vent 23 is disposed at the top of the cabinet 21, and the cabinet 21 is provided with a side for cool air to enter. The air deflection system includes at least one air deflection cabinet 22. An air vent 23 is disposed at the top of the air deflection cabinet 22, and the air deflection cabinet 22 is provided with an opening on a side. The opening-disposed side of the air deflection cabinet 22 clings to the air-vent-disposed side of the cabinet 21, a projection 112 of the opening 114 of the air deflection cabinet 22 on the side of the cabinet 21 overlaps the side air vent 23 of the cabinet 21, so that warm air exhausted through the side air vent 23 of the cabinet 21 enters the air deflection cabinet 22 through the opening of the air deflection cabinet 22, and is exhausted through the top air vent of the air deflection cabinet 22. The air deflection cabinet 22 further includes a fiber management unit 24 configured to coil up an optical fiber, for example, coiling up an overlong optical fiber or an extra optical fiber. In addition, the air deflection system further includes a connecting plate 25, where the air deflection cabinet 22 and the cabinet 21 are fastened together by using the connecting plate 25. The air defection system implements that air flows in from the front and flows out from the bottom for a cabinet, which changes a path of warm air, facilitates top exhaust or recycling of warm air in an equipment room, and improves efficiency of warm air processing of the equipment room.

In another embodiment of the present disclosure, an air vent is disposed at the top of a cabinet, the cabinet is provided with a side for cool air to enter, and the cabinet is provided with an opening on a side. An air vent is disposed in a lower part on a side of an air deflection cabinet, an air vent is disposed at the top of the air deflection cabinet, and the air-vent-disposed side of the air deflection cabinet clings to the opening-disposed side of the cabinet, so that warm air of the cabinet enters through the air vent of the air deflection cabinet, and is exhausted through the top air vent of the air deflection cabinet, which thereby also implements that air flows in from the front and flows out from the bottom for the cabinet, changes a path of warm air, facilitates top exhaust or recycling of warm air in an equipment room, and improves efficiency of warm air processing of the equipment room.

Figure 3:
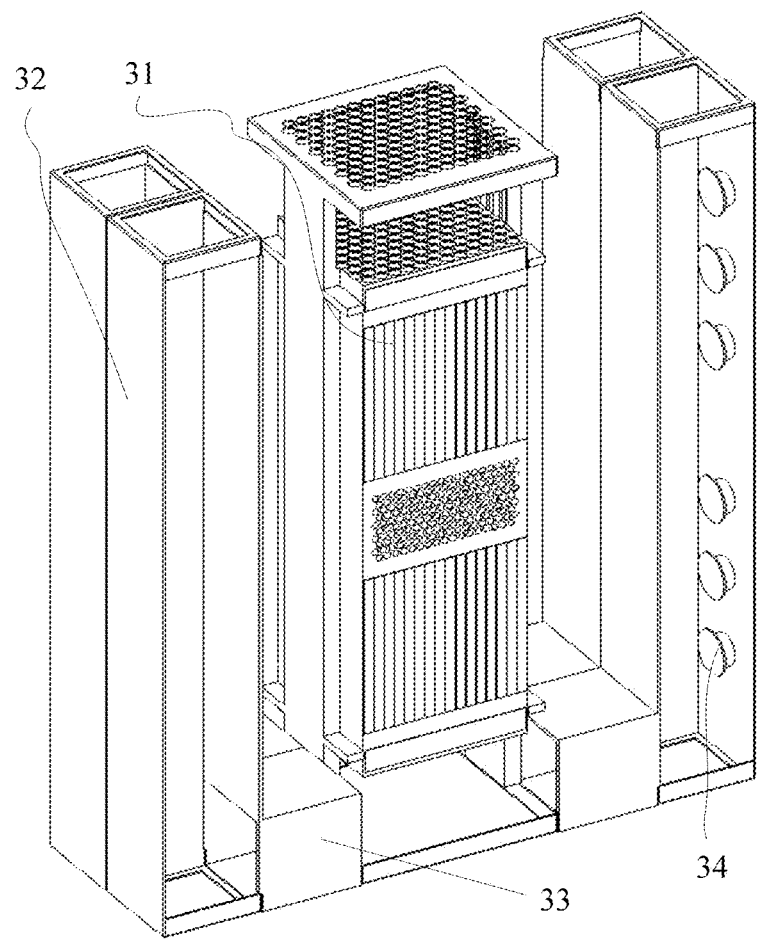
FIG. 3 is a schematic structural diagram of an air deflection system according to another embodiment of the present disclosure.

As shown in FIG. 3, an embodiment of the present disclosure provides another air deflection system, where the air deflection system includes a cabinet 31 and an air deflection cabinet 32. An air vent is disposed on a side of the cabinet 31, where the air vent is located in a lower part of the side of the cabinet 31. An air vent is disposed at the top of the cabinet 31, and the cabinet 31 is provided with a side for cool air to enter. The air deflection system includes at least one air deflection cabinet 32. An air vent is disposed at the top of the air deflection cabinet 32, and an air vent is disposed on a side of the air deflection cabinet 32. The air-vent-disposed side of the air deflection cabinet 32 is adjacent to the air-vent-disposed side of the cabinet 31, and the side air vent of the air deflection cabinet 32 is connected to the side air vent of the cabinet 31 by a duct 33, so that warm air exhausted through the side air vent of the cabinet 31 enters the air deflection cabinet 32 through the side air vent of the air deflection cabinet 32, and is exhausted through the top air vent of the air deflection cabinet 32. The air deflection cabinet 32 further includes a fiber management unit 34 configured to coil up an optical fiber. The air deflection system further includes a connecting plate, where the air deflection cabinet 32 and the cabinet 31 are fastened together by using the connecting plate. The air deflection system implements that air flows in from the front and flows out from the bottom for a cabinet, which changes a path of warm air, facilitates top exhaust or recycling of warm air in an equipment room, and improves efficiency of warm air processing of the equipment room.

Figure 4:
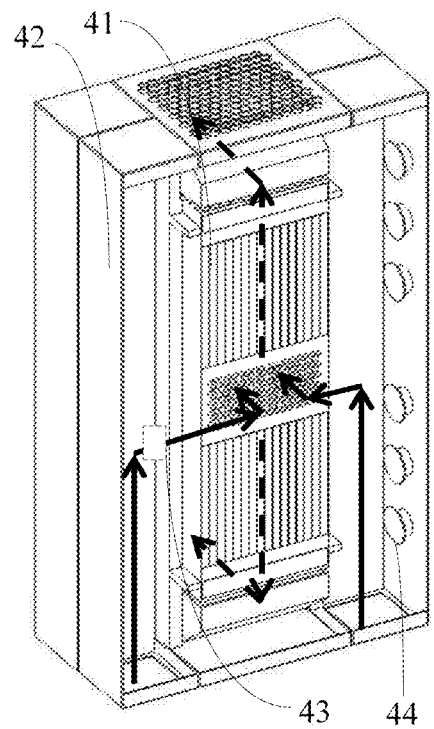
FIG. 4 is a schematic structural diagram of an air deflection system according to another embodiment of the present disclosure.

As shown in FIG. 4, an embodiment of the present disclosure provides another air deflection system, where the air deflection system includes a cabinet 41 and an air deflection cabinet 42. An air vent is disposed on a side of the cabinet 41, an air vent is disposed at the top of the cabinet 41, and an air vent is disposed in a lower part of the cabinet 41, where the lower air vent includes at least one of a lower air vent on the front of the cabinet 41 and a lower air vent on the back of the cabinet 41. The air deflection system includes at least one air deflection cabinet 42. An air vent is disposed at the bottom of the air deflection cabinet 42, an air vent 43 is disposed on a side of the air deflection cabinet 42, and the side air vent 43 of the air deflection cabinet 42 is in communication with the side air vent of the cabinet 41, so that cool air enters through the bottom air vent of the air deflection cabinet 42, and then enters the cabinet 41 through the side air vent 43 of the air deflection cabinet 42, thereby implementing precise air supply. The air deflection cabinet 42 further includes a fiber management unit 44 configured to coil up an optical fiber. A specification of the side air vent 43 of the air deflection cabinet 42 may be the same as or may be different from a specification of the side air vent of the cabinet 41, but the air-vent-disposed side of the air deflection cabinet 42 clings to the air-vent-disposed side of the cabinet 41, so that the side air vent of the air deflection cabinet 42 correspondingly is in communication with the air vent 43 on the air-vent-disposed side of the cabinet 41, and cool air in the air deflection cabinet 42 can directly reach a location of a high-power communications device inside the cabinet 41, thereby improving a heat dissipation effect of the high-power communications device. The side air vent 43 of the air deflection cabinet 42 may also be in communication with the side air vent 43 of the cabinet 41 by a duct.

Figure 5:
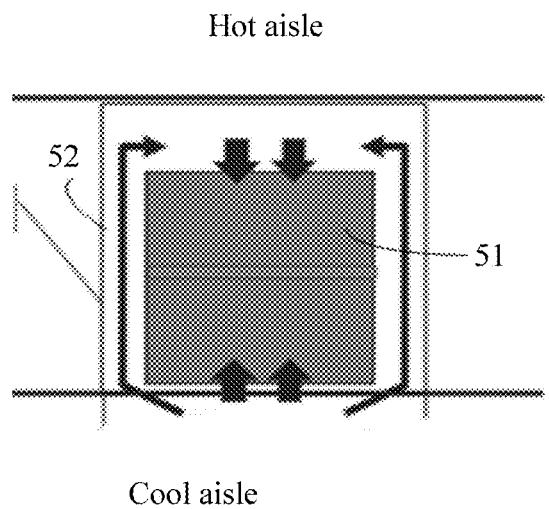
FIG. 5, FIG. 6, and FIG. 7 are schematic structural diagrams of an air deflection system according to another embodiment of the present disclosure.
Figure 6:
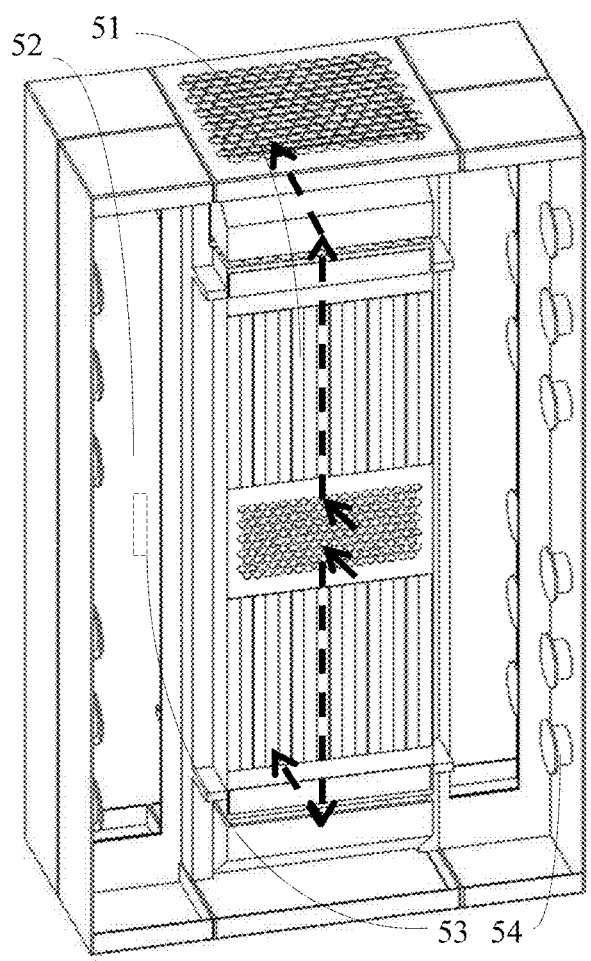
Figure 7:
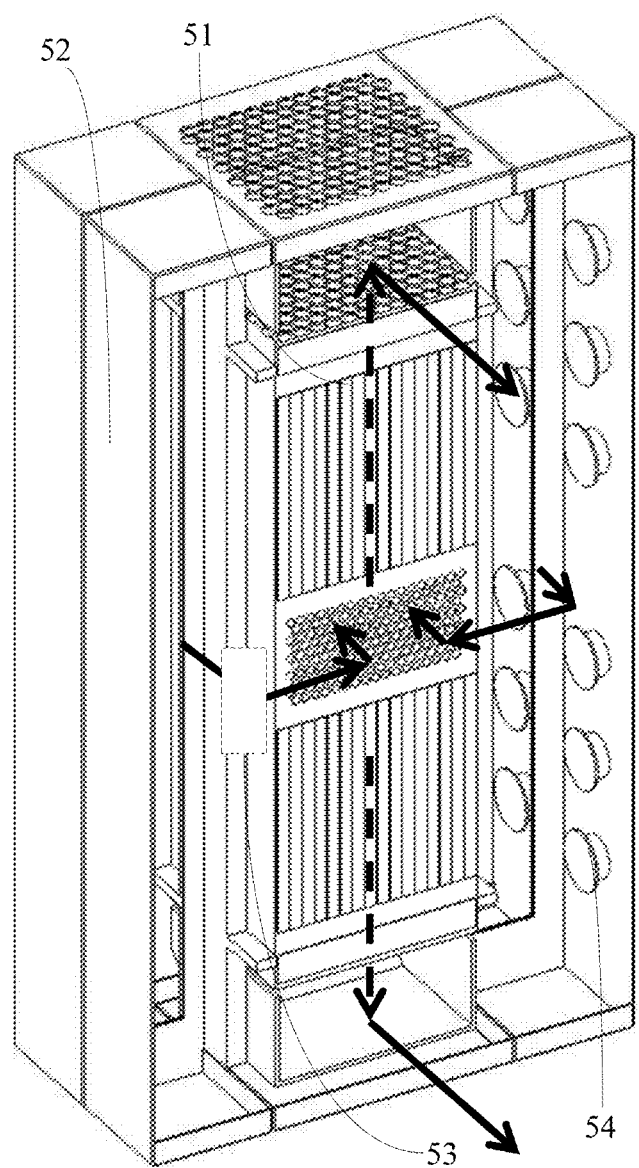

As shown in FIG. 5, FIG. 6, and FIG. 7, an embodiment of the present disclosure provides another air deflection system, where the air deflection system includes a double-faced cabinet 51 and an air deflection cabinet 52. The double-faced cabinet 51 is located in an equipment room with separated cold and hot aisles. An air vent is disposed at both the top and the bottom of the double-faced cabinet 51, and an air vent is disposed on the front of the double-faced cabinet 51, where the front of the double-faced cabinet 51 is located in the cold aisle, so that cool air can enter though the front air vent. An air vent is disposed in both an upper part of the back and a lower part of the back of the double-faced cabinet 51. The back of the double-faced cabinet 51 is located in the hot aisle, an air vent is disposed on a side of the double-faced cabinet 51, and the air vent is close to the back of the double-faced cabinet 51. The air deflection system includes at least one air deflection cabinet 52. An air vent is disposed on the front of the air deflection cabinet 52, and the front of the air deflection cabinet 52 is located in the cold aisle. An air vent 53 is disposed on a side of the air deflection cabinet 52, the air-vent-disposed side of the air deflection cabinet 52 clings to the air-vent-disposed side of the cabinet, and the side air vent 53 of the air deflection cabinet 52 is in communication with the side air vent of the cabinet, so that cool air can enter the air deflection cabinet through the front air vent of the air deflection cabinet 52, and enter the double-faced cabinet 51 through the side air vent 53 of the air deflection cabinet 52. The air deflection system further includes at least two air deflectors, where at least one air deflector of the air deflectors is connected to the top air vent of the double-faced cabinet 51, and at least one air deflector of the air deflectors is connected to the bottom air vent of the double-faced cabinet 51, so that the double-faced cabinet 51 exhausts warm air towards the hot aisle.

A specification of the side air vent 53 of the air deflection cabinet 52 may be the same as or may be different from a specification of the side air vent of the cabinet, and a location of the side air vent of the air deflection cabinet 52 is corresponding to a location of the side air vent of the double-faced cabinet 51, so that cool air in the air deflection cabinet 52 can enter the double-faced cabinet 51 through the side air vent of the double-faced cabinet 51. The air deflection cabinet 52 further includes a fiber management unit 54 configured to coil up an optical fiber.

Further, the air deflection system further includes a connecting plate, where the air deflection cabinet 52 and the cabinet 51 are fastened together by using the connecting plate.

It can be known from the foregoing that in the embodiment of the present disclosure, the heat dissipation efficiency of communications device located on the back of the double-faced cabinet is improved.

As shown in FIG. 5 to FIG. 7, the equipment room with separated cold and hot aisles includes a cold aisle and a hot aisle. A side for cool air to enter is the cold aisle. Cool air that takes away heat when flowing through a communications device changes into warm air, and therefore, the other side is called the hot aisle. The double-faced cabinet 51 is a double-faced cabinet that is located in the equipment room with separated cold and hot aisles. One face of the double-faced cabinet 51 is the front and is located in the cold aisle, where an air vent is disposed on the front of the double-faced cabinet 51, so that cool air enters from the front. The other face of the cabinet 51 is the back, and is located in the hot aisle. The front of the air deflection cabinet is located in the cool aisle, so that cool air can enter through the front air vent. The side air vent of the air deflection cabinet 52 is connected to the side air vent of the double-faced cabinet 51, so that cool air can enter the back of the double-faced cabinet 51 through the air deflection cabinet 52. The air vents at the bottom and the top of the double-faced cabinet 51 are used for air exhaust. A location of the side air vent of the double-faced cabinet 51 is close to the back of the double-faced cabinet 51, so that cool air can directly enter from the back of the double-faced cabinet 51, thereby improving the back heat dissipation efficiency of the double-faced cabinet 51.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. An air deflection system, comprising:
    a cabinet, a cabinet first air vent being disposed on a cabinet first side, the cabinet first air vent being located in a lower part of the cabinet first side, a cabinet second air vent being disposed at a top of the cabinet, and the cabinet being provided with a cabinet third air vent on a cabinet second side for cool air to enter; and
    at least one air deflection cabinet, an air deflection cabinet first air vent being disposed at a top of the air deflection cabinet, an air deflection cabinet second air vent being disposed on an air deflection cabinet first side, the air deflection cabinet first side being proximate to the cabinet first side, the air deflection cabinet second air vent being in communication with the cabinet first air vent such that warm air exhausted through the cabinet first air vent enters the air deflection cabinet through the air deflection cabinet second air vent and is exhausted through the air deflection cabinet first air vent, the air deflection system comprising a first air flow path and a second air flow path, both the first air flow path and the second air flow path entering the air deflection system through the cabinet third air vent, the first air flow path comprising entering the air deflection system through the cabinet third air vent, passing over a first set of communication devices in the cabinet, and exiting the air deflection system through the cabinet second air vent, and the second air flow path comprising entering the air deflection system through the cabinet third air vent, passing over a second set of communication devices in the cabinet, passing through the cabinet first air vent, passing through the second air deflection cabinet air vent, and exiting the air deflection system through the air deflection cabinet first air vent.

2. The air deflection system of claim 1, wherein a dimension of the cabinet first air vent is the same as a dimension of the air deflection cabinet second air vent, and a location of the cabinet first air vent corresponds to a location of the air deflection cabinet second air vent.

3. The air deflection system of claim 1, wherein the air deflection cabinet further comprises a fiber management structure configured to coil up an optical fiber.

4. The air deflection system of claim 1, wherein the air deflection system further comprises a connecting plate, and the air deflection cabinet and the cabinet are fastened together using the connecting plate.

5. The air deflection system of claim 1, wherein the cabinet third air vent is located at a center of the cabinet second side.

6. The air deflection system of claim 1, wherein the first set of communication devices are located at an upper portion of the cabinet, and the second set of communication devices are located at a lower portion of the cabinet.

7. The air deflection system of claim 1, wherein the cabinet third air vent is located between the first set of communication devices and the second set of communication devices.

8. The air deflection system of claim 1, wherein the first air flow path and the second air flow path travel in opposite directions after entering the cabinet third air vent.

9. The air deflection system, of claim 1, wherein the cabinet third air vent is located at a center of the cabinet second side, the first set of communication devices are located at an upper portion of the cabinet, the second set of communication devices are located at a lower portion of the cabinet, the cabinet third air vent is located between the first set of communication devices and the second set of communication devices, and the first air flow path and the second air flow path travel in opposite directions after entering the cabinet third air vent.

10. An air deflection system, comprising:
    a cabinet, a cabinet first air vent being disposed on a cabinet first side, the cabinet first air vent being located in a lower part of the cabinet first side, a cabinet second air vent being disposed at a top of the cabinet, and the cabinet being provided with a cabinet third air vent on a cabinet second side for cool air to enter; and
    at least one air deflection cabinet, an air deflection cabinet first air vent being disposed at a top of the air deflection cabinet, an air deflection cabinet first side being provided with an opening, the air deflection cabinet first side being proximate to the cabinet first side, the opening of the air deflection cabinet on the cabinet first side overlapping the cabinet first air vent of the cabinet such that warm air exhausted through the cabinet first air vent enters the air deflection cabinet through the opening of the air deflection cabinet and is exhausted through the air deflection cabinet first air vent, the air deflection system comprising a first air flow path and a second air flow path, both the first air flow path and the second air flow path entering the air deflection system through the cabinet third air vent, the first air flow path comprising entering the air deflection system through the cabinet third air vent, passing over a first set of communication devices in the cabinet, and exiting the air deflection system through the cabinet second air vent, and the second air flow path comprising entering the air deflection system through the cabinet third air vent, passing over a second set of communication devices in the cabinet, passing through the cabinet first air vent, and exiting the air deflection system through the air deflection cabinet first air vent.

11. The air deflection system of claim 10, wherein the air deflection cabinet further comprises a fiber management structure configured to coil up an optical fiber.

12. The air deflection system of claim 10, wherein the air deflection system further comprises a connecting plate, and the air deflection cabinet and the cabinet are fastened together using the connecting plate.

13. The air deflection system of claim 10, wherein the cabinet third air vent is located at a center of the cabinet second side.

14. The air deflection system of claim 10, wherein the first set of communication devices are located at an upper portion of the cabinet, and the second set of communication devices are located at a lower portion of the cabinet.

15. The air deflection system of claim 10, wherein the cabinet third air vent is located between the first set of communication devices and the second set of communication devices.

16. The air deflection system of claim 10, wherein the first air flow path and the second air flow path travel in opposite directions after entering the cabinet third air vent.

17. The air deflection system of claim 10, wherein the cabinet third air vent is located at a center of the cabinet second side, the first set of communication devices are located at an upper portion of the cabinet, the second set of communication devices are located at a lower portion of the cabinet, the cabinet third air vent is located between the first set of communication devices and the second set of communication devices, and the first air flow path and the second air flow path travel in opposite directions after entering the cabinet third air vent.

* * * * *